US012773721B2

(12) United States Patent
Jiang

(10) Patent No.: US 12,773,721 B2
(45) Date of Patent: Oct. 27, 2026

(54) ULTRASONIC TRANSDUCER INCLUDING A PIEZOELECTRIC MATERIAL LAYER HAVING A PROTRUSION STRUCTURE OR A RECESS STRUCTURE

(71) Applicant: Qisda Corporation, Taoyuan City (TW)

(72) Inventor: Fu-Sheng Jiang, Taoyuan City (TW)

(73) Assignee: Qisda Corporation, Taoyuan City (TW)

( * ) Notice: Subject to any disclaimer, the term of this patent is extended or adjusted under 35 U.S.C. 154(b) by 938 days.

(21) Appl. No.: 18/163,883

(22) Filed: Feb. 3, 2023

(65) Prior Publication Data

US 2023/0381817 A1 Nov. 30, 2023

(30) Foreign Application Priority Data

May 26, 2022 (TW) .................................. 111119750

(51) Int. Cl.

*B06B 1/06* (2006.01)
*H03H 9/13* (2006.01)
*H03H 9/15* (2006.01)

(52) U.S. Cl.

CPC ............ *B06B 1/0607* (2013.01); *B06B 1/067* (2013.01); *H03H 9/131* (2013.01); *H03H 9/15* (2013.01)

(58) Field of Classification Search

CPC ...... B06B 1/0607; B06B 1/067; H03H 9/131; H03H 9/15

See application file for complete search history.

(56) References Cited

U.S. PATENT DOCUMENTS

| | | | | |
|---|---|---|---|---|
| 4,375,818 | A * | 3/1983 | Suwaki ................ | A61B 8/4461 600/463 |
| 5,122,993 | A | 6/1992 | Hikita et al. | |
| 5,295,487 | A * | 3/1994 | Saitoh ........................ | B06B 1/06 600/459 |
| 7,573,181 | B2 | 8/2009 | Rhim et al. | |
| 9,108,221 | B2 | 8/2015 | Galluzzo et al. | |
| 9,660,170 | B2 | 5/2017 | Tajati | |
| 2012/0056512 | A1* | 3/2012 | Jin ....................... | G10K 11/004 310/335 |
| 2012/0206014 | A1* | 8/2012 | Bibl ....................... | G10K 11/32 310/330 |
| 2014/0103781 | A1* | 4/2014 | Nakamura ............. | H10N 30/20 310/334 |

FOREIGN PATENT DOCUMENTS

| | | |
|---|---|---|
| CN | 103958079 | 7/2014 |
| TW | 202127912 | 7/2021 |

* cited by examiner

*Primary Examiner* — Emily P Pham
(74) *Attorney, Agent, or Firm* — JCIPRNET

(57) ABSTRACT

An ultrasonic transducer includes a piezoelectric material layer, a first electrode layer, and a second electrode layer. The piezoelectric material layer has an ultrasonic wave emitting side and a back side opposite to the ultrasonic wave emitting side. The piezoelectric material layer has a protrusion structure or a recess structure on the back side. The protrusion structure or the recess structure overlaps a central axis of the piezoelectric material layer. The first electrode layer is disposed on the back side of the piezoelectric material layer. The second electrode layer is disposed on the ultrasonic wave emitting side of the piezoelectric material layer.

20 Claims, 6 Drawing Sheets

ULTRASONIC TRANSDUCER INCLUDING A PIEZOELECTRIC MATERIAL LAYER HAVING A PROTRUSION STRUCTURE OR A RECESS STRUCTURE

CROSS-REFERENCE TO RELATED APPLICATION

This application claims the priority benefit of Taiwan patent application no. 111119750, filed on May 26, 2022. The entirety of the above-mentioned patent application is hereby incorporated by reference herein and made a part of this specification.

BACKGROUND

Technical Field

The disclosure relates to a transducer; more particularly, the disclosure relates to an ultrasonic transducer.

Description of Related Art

An ultrasonic transducer is a transducer that realizes the mutual conversion of acoustic energy and electrical energy within the frequency range of ultrasonic waves and can mainly be categorized into three types: (a) a transmitter, (b) a receiver, and (c) a dual-purpose transducer acting as a transmitter and a receiver. The transducer used for transmitting the ultrasonic waves is called the transmitter. When the transducer is in a transmitting state, the electrical energy is converted into mechanical energy and then into the acoustic energy. The transducer used for receiving the ultrasonic waves is called the receiver. When the transducer is in a receiving state, the acoustic energy is converted into the mechanical energy and then into the electrical energy. In some cases, the transducer may serve as the transmitter and the receiver and is called the dual-purpose transducer, which is one of the key factors and determinants in the field of ultrasonic technologies and has been extensively applied to fields of non-destructive testing (NDT), medical imaging, ultrasound microscopy, fingerprint recognition, Internet of Things (IoT), and so forth.

In a conventional ultrasonic transducer, a piezoelectric material has a single-layer thickness designed as half the wavelength of the sound wave, whereas the resultant electrical waveform is not ideal; accordingly, ring-down signals cannot be restrained, and the resolution cannot be easily improved.

SUMMARY

The disclosure provides an ultrasonic transducer which is capable of effectively restraining ring-down signals and further improving resolution.

An embodiment of the disclosure provides an ultrasonic transducer that includes a piezoelectric material layer, a first electrode layer, and a second electrode layer. The piezoelectric material layer has an ultrasonic wave emitting side and a back side opposite to the ultrasonic wave emitting side. The piezoelectric material layer has a protrusion structure or a recess structure on the back side. The protrusion structure or the recess structure overlaps a central axis of the piezoelectric material layer. The first electrode layer is disposed on the back side of the piezoelectric material layer. The second electrode layer is disposed on the ultrasonic wave emitting side of the piezoelectric material layer.

Another embodiment of the disclosure provides an ultrasonic transducer that includes a piezoelectric material layer, a first electrode layer, and a second electrode layer. The piezoelectric material layer has an ultrasonic wave emitting side and a back side opposite to the ultrasonic wave emitting side, and the piezoelectric material layer has a protrusion structure or a recess structure on the back side. The protrusion structure or the recess structure has a width d, the back side of the piezoelectric material layer has a width D, and $d>D/5$. The first electrode layer is disposed on the back side of the piezoelectric material layer. The second electrode layer is disposed on the ultrasonic wave emitting side of the piezoelectric material layer.

In the ultrasonic transducer provided in one or more embodiments of the disclosure, the piezoelectric material layer has the protrusion structure or the recess structure on the back side, so as to generate a plurality of sets of vibration frequencies. Such a combination of frequencies ensures the restraint of ring-down signals of electrical waveforms, so as to further improve the resolution of ultrasonic waves and optimize the quality of ultrasonic images.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF THE EMBODIMENTS

Figure 1A:
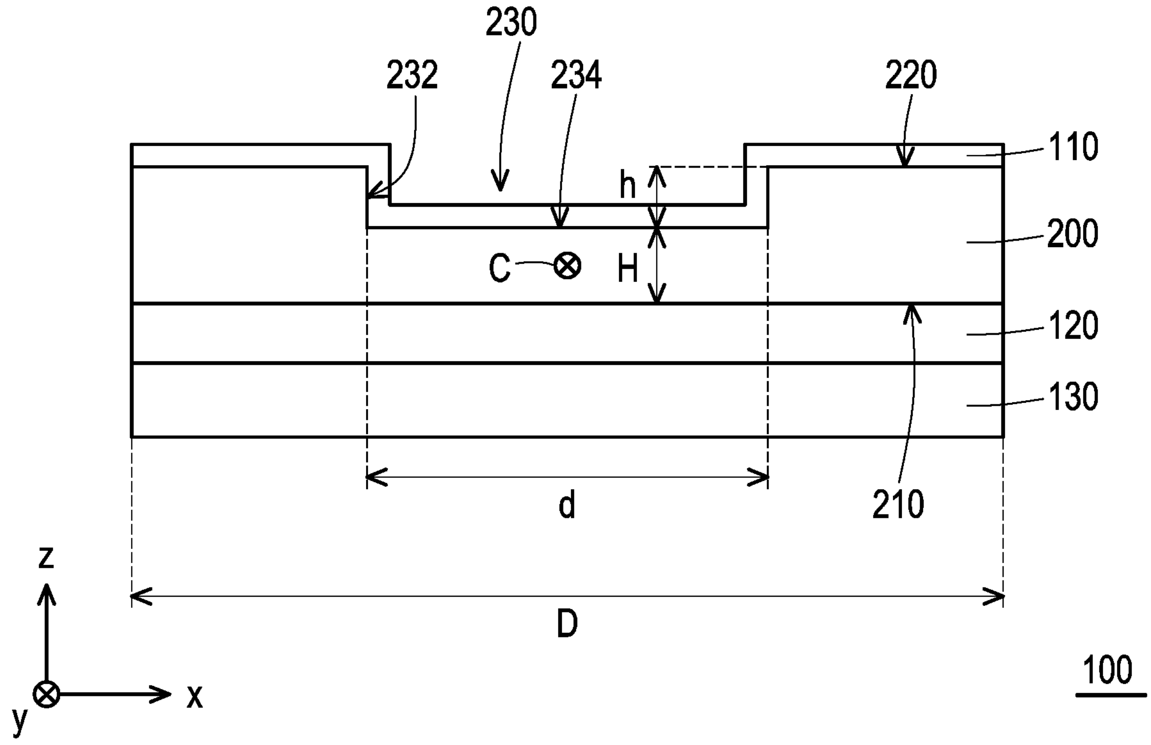
FIG. 1A is a schematic cross-sectional view of an ultrasonic transducer according to an embodiment of the disclosure.
Figure 1B:
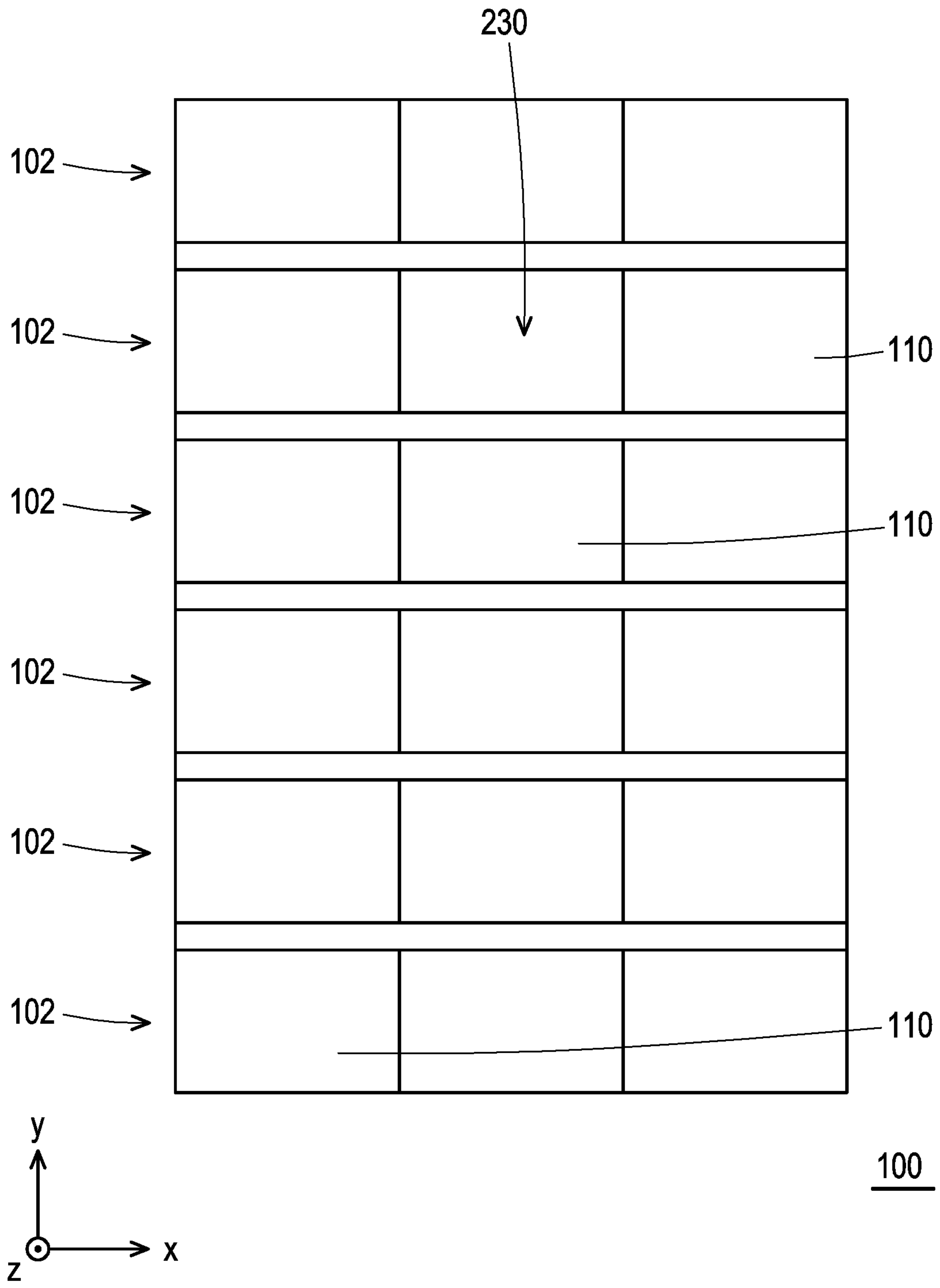
FIG. 1B is a schematic top view of the ultrasonic transducer depicted in FIG. 1A.

FIG. 1A is a schematic cross-sectional view of an ultrasonic transducer according to an embodiment of the disclosure. FIG. 1B is a schematic top view of the ultrasonic transducer depicted in FIG. 1A. With reference to FIG. 1A and FIG. 1B, an ultrasonic transducer 100 provided in this embodiment includes a piezoelectric material layer 200, a first electrode layer 110, and a second electrode layer 120. The piezoelectric material layer 220 has an ultrasonic wave emitting side 210 and a back side 220 opposite to the ultrasonic wave emitting side 210. In this embodiment, the piezoelectric material layer 200 has a recess structure 230 on the back side 230, and the recess structure 230 overlaps a central axis C of the piezoelectric material layer 200. That is, a center of the piezoelectric material layer 200 in an x-direction overlaps the recess structure 230. The recess structure 230 may be located at the center of the piezoelectric material layer 200 in the x-direction or may deviate from the center but still overlap the central axis C. The first electrode layer 110 is disposed on the back side 220 of the piezoelectric material layer 200. The second electrode layer 120 is disposed on the ultrasonic wave emitting side 210 of the piezoelectric material layer 200.

When a voltage difference is applied between the first electrode layer 110 and the second electrode layer 120, the piezoelectric material layer 200 is deformed and emits an ultrasonic wave from the ultrasonic wave emitting side 210. After the ultrasonic wave is reflected by a foreign object, the ultrasonic wave returns to and vibrates the piezoelectric material layer 200. The vibrated piezoelectric material layer 200 generates a voltage signal between the first electrode layer 110 and the second electrode layer 120, and location information of the foreign object may be obtained by analyzing the voltage signal generated between the first electrode layer 110 and the second electrode layer 120.

The natural resonant frequency of the piezoelectric material layer 200 is associated with the thickness of the piezoelectric material layer 200. In the ultrasonic transducer 100 provided in this embodiment, the piezoelectric material layer 200 has the recess structure 230 on the back side 220, which leads to different thicknesses of the piezoelectric material layer 200 and further generates a plurality of sets of vibration frequencies. Such a combination of frequencies ensures the restraint of ring-down signals of electrical waveforms, so as to further improve the resolution of ultrasonic waves and optimize the quality of ultrasonic images.

Figure 2A:
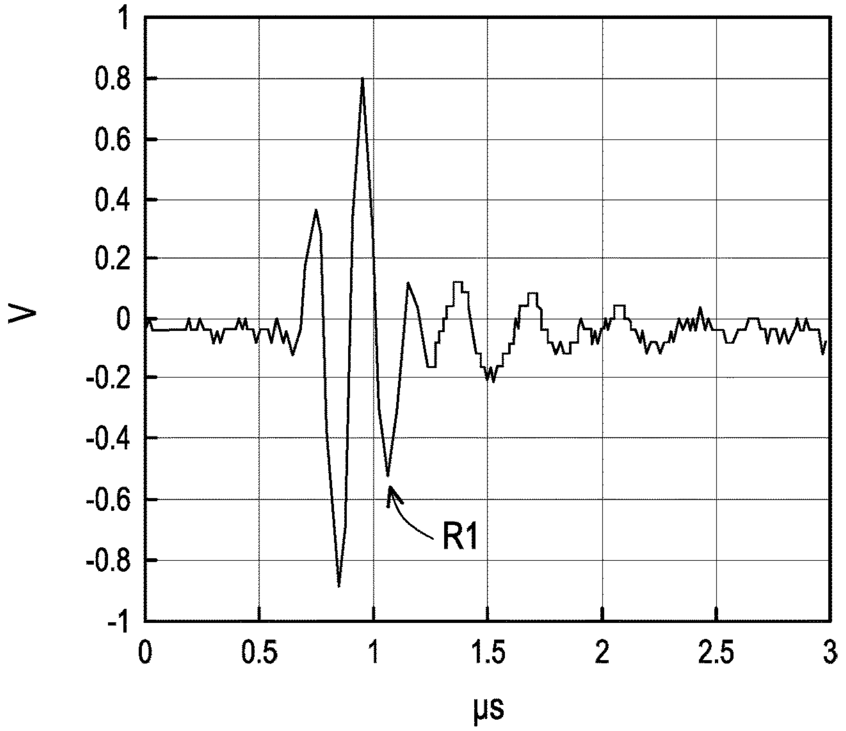
FIG. 2A is a curve diagram illustrating variations in a peak-to-peak voltage relative to time according to a comparative example ultrasonic transducer where the piezoelectric material layer of the ultrasonic transducer does not have the recess structure, and the peak-to-peak voltage is generated after the ultrasonic transducer receives an ultrasonic wave.
Figure 2B:
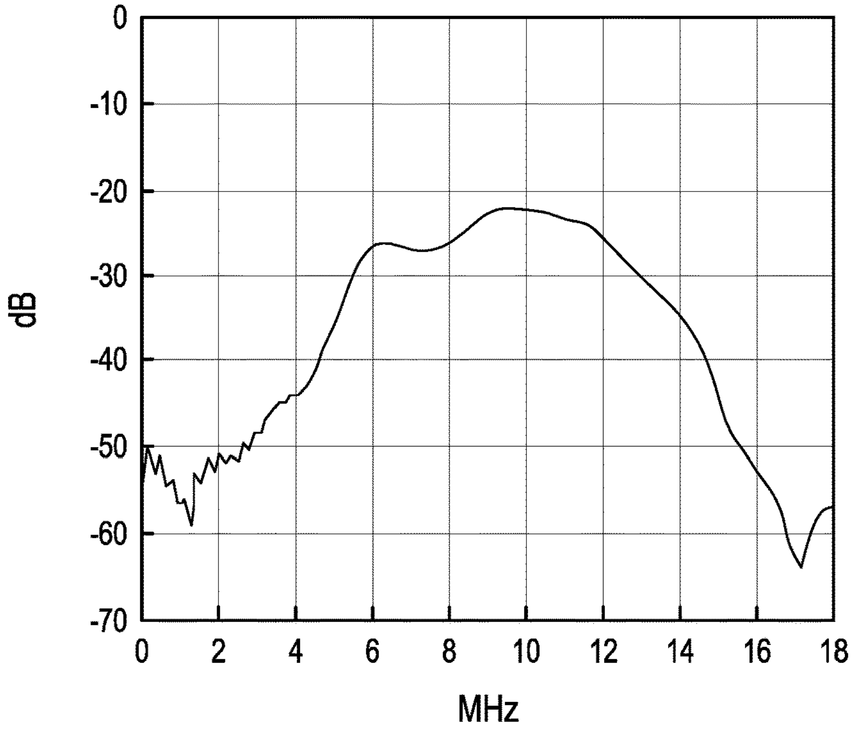
FIG. 2B is a frequency spectrum illustrating a ratio of a voltage generated after the ultrasonic transducer depicted in FIG. 2A in the comparative example ultrasonic transducer receives an ultrasonic wave to a driving voltage of the comparative example ultrasonic transducer emitting the ultrasonic wave.
Figure 3A:
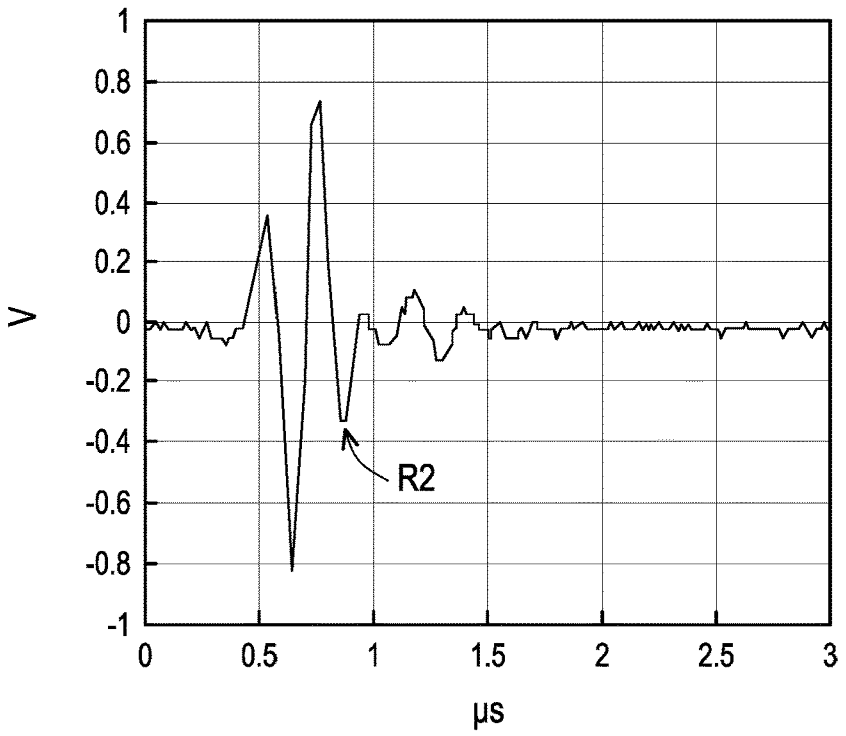
FIG. 3A is a curve diagram illustrating variations in a peak-to-peak voltage relative to time, and the peak-to-peak voltage is generated after the ultrasonic transducer depicted in FIG. 1A receives an ultrasonic wave.
Figure 3B:
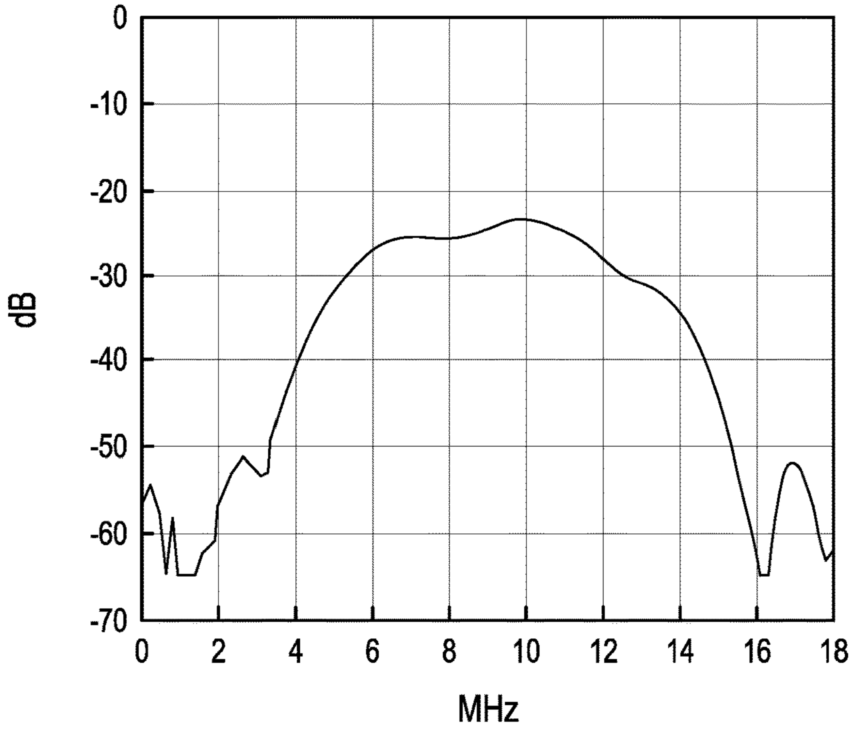
FIG. 3B is a frequency spectrum illustrating a ratio of a voltage generated after the ultrasonic transducer depicted in FIG. 1A receives an ultrasonic wave to a driving voltage of the ultrasonic transducer emitting the ultrasonic wave.

FIG. 2A is a curve diagram illustrating variations in a peak-to-peak voltage relative to time according to a comparative example ultrasonic transducer where the piezoelectric material layer of the ultrasonic transducer does not have the recess structure, and the peak-to-peak voltage is generated after the ultrasonic transducer receives an ultrasonic wave. FIG. 2B is a frequency spectrum illustrating a ratio of a voltage generated after the ultrasonic transducer depicted in FIG. 2A in the comparative example ultrasonic transducer receives an ultrasonic wave to a driving voltage of the comparative example ultrasonic transducer emitting the ultrasonic wave. FIG. 3A is a curve diagram illustrating variations in a peak-to-peak voltage relative to time, and the peak-to-peak voltage is generated after the ultrasonic transducer depicted in FIG. 1A receives an ultrasonic wave. FIG. 3B is a frequency spectrum illustrating a ratio of a voltage generated after the ultrasonic transducer depicted in FIG. 1A receives an ultrasonic wave to a driving voltage of the ultrasonic transducer emitting the ultrasonic wave. In FIG. 2A and FIG. 3A, the vertical axis denotes a peak-to-peak voltage in volts (V), and the horizontal axis denotes time in microseconds (μs). In FIG. 2B and FIG. 3B, the vertical axis denotes a ratio (in decibels, dB) of the voltage generated after receiving the ultrasonic wave to the driving voltage of emitting the ultrasonic wave, and the horizontal axis denotes a frequency in megahertz (MHz). The result of comparing FIG. 2A and FIG. 3A indicates that a ring-down signal R1 of the ultrasonic transducer provided in the comparative example is greater than a ring-down signal R2 of the ultrasonic transducer 100 provided in this embodiment, which verifies that the ultrasonic transducer provided in this embodiment is indeed able to restrain the ring-down signal.

In this embodiment, the recess structure 230 has a width d, the back side 220 of the piezoelectric material layer 200*b* has a width D, and d>D/5; besides, in an embodiment of the disclosure, D/5<d<D/2.

In this embodiment, the recess structure 230 has two sidewall surfaces 232 opposite to each other and a bottom surface 234, and the bottom surface 234 is connected to the two sidewall surfaces 232. Besides, in this embodiment, the two sidewall surfaces 232 are perpendicular to the bottom surface 234.

In this embodiment, the second electrode layer 120 is a matching layer. Besides, in this embodiment, the ultrasonic transducer 100 further includes another matching layer 130 disposed below the second electrode layer 120, and the matching layer 130 is an insulation layer. The matching layer 130 allows the acoustic impedance from the piezoelectric material layer 200 to an object under test to change in a moderate manner, so that the ultrasonic wave may be smoothly transmitted to the object under test. Here, the object under test is, for instance, a human body or an animal. However, according to other embodiments, the ultrasonic transducer 100 may not be equipped with the matching layer 130 in response to different applications.

In this embodiment, the piezoelectric material layer 200 is divided into a plurality of sections (as shown in FIG. 1B) in an extension direction (e.g., the y-direction), and the first electrode layer 110 is divided into a plurality of sections in the extension direction (i.e., the y-direction) to form a plurality of elements 102 arranged in the extension direction (i.e., the y-direction). Performing a sensing operation by adopting the plurality of elements 102 allows an ultrasonic image to have a plurality of pixels arranged on a plane. In an embodiment, the ultrasonic transducer 100 is, for instance, a linear transducer, a phased array transducer, or a curved transducer, wherein the curved transducer may extend in a curved shape in the y-direction. However, in other embodiments, the ultrasonic transducer 100 may also be a single-element transducer, such as a circular transducer. Alternatively, in other embodiments, the ultrasonic transducer 100 may also be a combination of at least two of the linear transducer, the phased array transducer, the curved transducer, and the circular transducer. In FIG. 1A and FIG. 1B, a z-direction is perpendicular to the second electrode layer 120, the x-direction and the y-direction are parallel to the second electrode layer 120, and the x-direction, the y-direction, and the z-direction are perpendicular to one another. Besides, the central axis C is, for instance, parallel to the y-direction.

In this embodiment, a depth of the recess structure 230 is h, the piezoelectric material layer 200 at the recess structure 230 has a thickness H, and $1/10 < h/H < 1/3$.

Figure 4:
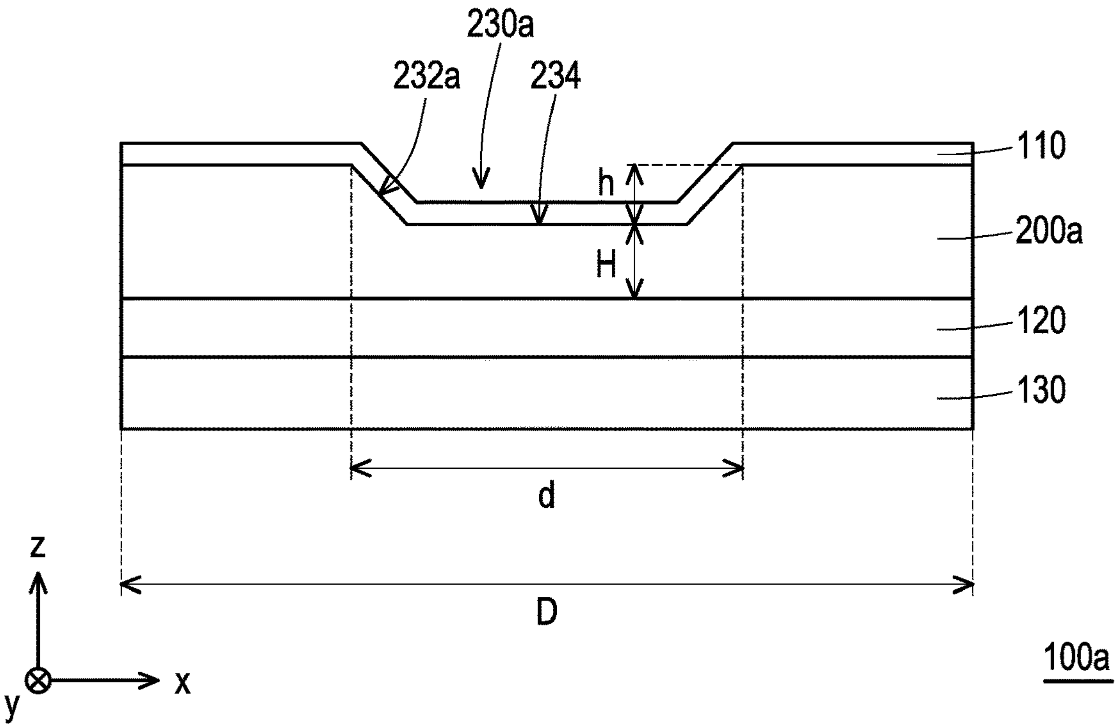
FIG. 4 is a schematic cross-sectional view of an ultrasonic transducer according to another embodiment of the disclosure.

FIG. 4 is a schematic cross-sectional view of an ultrasonic transducer according to another embodiment of the disclosure. With reference to FIG. 4, an ultrasonic transducer 100*a* provided in this embodiment is similar to the ultrasonic transducer 100 depicted in FIG. 1A, while the difference therebetween are explained hereinafter. In the ultrasonic transducer 100*a* provided in this embodiment, two sidewall surfaces 232*a* of a recess structure 230*a* of a piezoelectric material layer 200*a* are inclined relative to the bottom surface 234, so that the resultant piezoelectric material layer 200*a* with such a design may have different thicknesses to generate a plurality of sets of vibration frequencies and further restrain the ring-down signals effectively.

Figure 5:
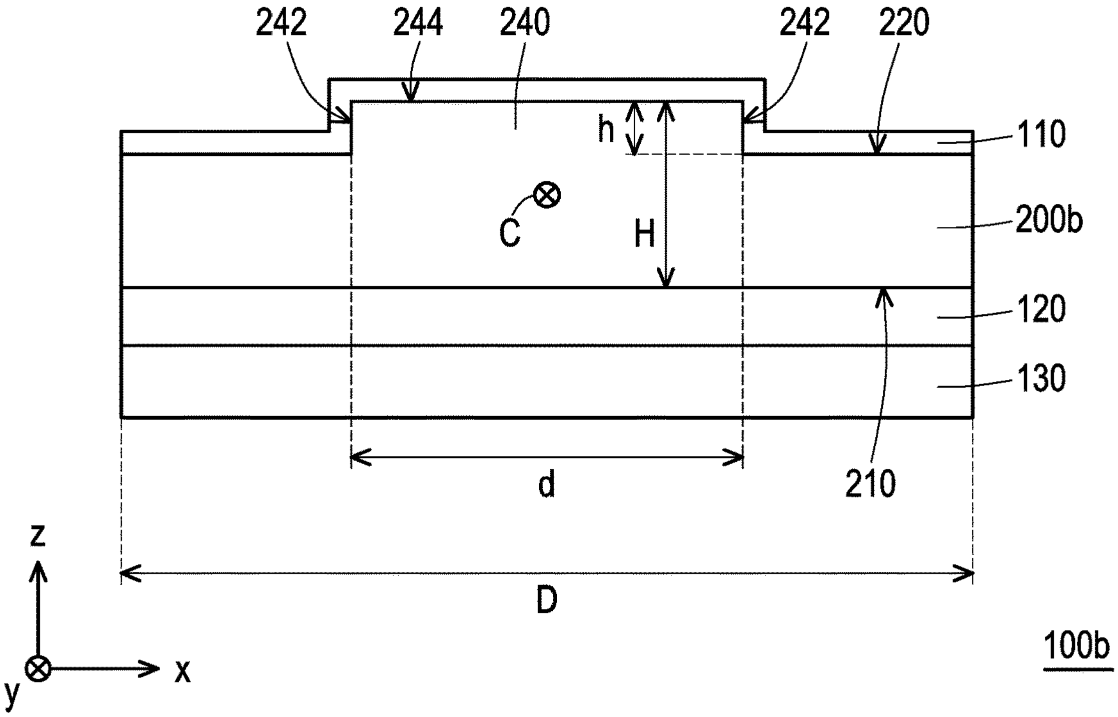
FIG. 5 is a schematic cross-sectional view of an ultrasonic transducer according to still another embodiment of the disclosure.

FIG. 5 is a schematic cross-sectional view of an ultrasonic transducer according to still another embodiment of the disclosure. With reference to FIG. 5, an ultrasonic transducer 100*b* provided in this embodiment is similar to the ultrasonic transducer 100 depicted in FIG. 1A, while the difference therebetween are explained hereinafter. In the ultrasonic transducer 100*b* provided in this embodiment, a piezoelectric material layer 200*b* has a protrusion structure 240 on the back side 220 to replace the recess structure 230 depicted in FIG. 1A. The protrusion structure 240 overlaps the central axis C of the piezoelectric material layer 200*b*.

In this embodiment, the protrusion structure 240 has two sidewall surfaces 242 opposite to each other and a top surface 244, and the top surface 244 is connected to the two sidewall surfaces 242. Besides, in this embodiment, the two sidewall surfaces 242 are perpendicular to the top surface 244.

In this embodiment, the protrusion structure 240 has a width d, the back side 220 of the piezoelectric material layer 200*b* has a width D, and $d > D/5$; in an embodiment of the disclosure, $D/5 < d < D/2$. Besides, in this embodiment, a height of the protrusion structure 240 is h, the piezoelectric material layer 200*b* at the protrusion structure 240 has a thickness H, and $1/10 < h/H < 1/3$.

As such, the resultant piezoelectric material layer 200*b* with such a design may have different thicknesses to generate a plurality of sets of vibration frequencies and further restrain the ring-down signals effectively.

Figure 6:
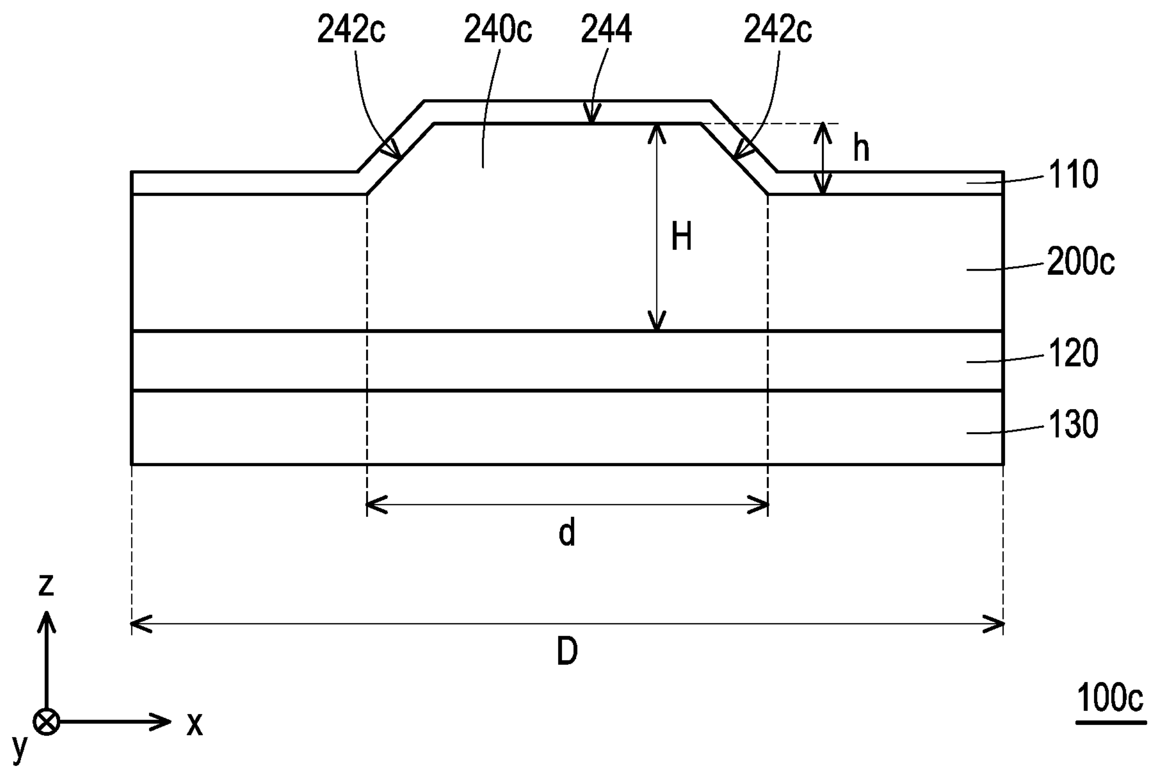
FIG. 6 is a schematic cross-sectional view of an ultrasonic transducer according to still another embodiment of the disclosure.

FIG. 6 is a schematic cross-sectional view of an ultrasonic transducer according to still another embodiment of the disclosure. With reference to FIG. 6, an ultrasonic transducer 100*c* provided in this embodiment is similar to the ultrasonic transducer 100*b* depicted in FIG. 5, while the difference therebetween are explained hereinafter. In the ultrasonic transducer 100*c* provided in this embodiment, two sidewall surfaces 242*c* of a protrusion structure 240*c* of a piezoelectric material layer 200*c* are inclined relative to the top surface 244, so that the resultant piezoelectric material layer 200*c* with such a design may have different thicknesses to generate a plurality of sets of vibration frequencies and further restrain the ring-down signals effectively.

To sum up, in the ultrasonic transducer provided in one or more embodiments of the disclosure, the piezoelectric material layer has the protrusion structure or the recess structure on the back side, so as to generate a plurality of sets of vibration frequencies. Such a combination of frequencies ensures the restraint of the ring-down signals of the electrical waveforms, so as to further improve the resolution of the ultrasonic waves and optimize the quality of the ultrasonic images.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An ultrasonic transducer, comprising:

a piezoelectric material layer, having an ultrasonic wave emitting side and a back side opposite to the ultrasonic wave emitting side, wherein the piezoelectric material layer has a protrusion structure or a recess structure only on the back side but not on the ultrasonic wave emitting side, and the protrusion structure or the recess structure overlaps a central axis of the piezoelectric material layer;

a first electrode layer, disposed on the back side of the piezoelectric material layer; and a second electrode layer, disposed on the ultrasonic wave emitting side of the piezoelectric material layer.

2. The ultrasonic transducer according to claim 1, wherein the piezoelectric material layer has the recess structure on the back side, the recess structure has two sidewall surfaces opposite to each other and a bottom surface, and the bottom surface is connected to the two sidewall surfaces.

3. The ultrasonic transducer according to claim 2, wherein the two sidewall surfaces are perpendicular to the bottom surface.

4. The ultrasonic transducer according to claim 2, wherein the two sidewall surfaces are inclined relative to the bottom surface.

5. The ultrasonic transducer according to claim 1, wherein the piezoelectric material layer has the protrusion structure on the back side, the protrusion structure has two sidewall surfaces opposite to each other and a top surface, and the top surface is connected to the two sidewall surfaces.

6. The ultrasonic transducer according to claim 5, wherein the two sidewall surfaces are perpendicular to the top surface.

7. The ultrasonic transducer according to claim 5, wherein the two sidewall surfaces are inclined relative to the top surface.

8. The ultrasonic transducer according to claim 1, wherein the second electrode layer is a matching layer.

9. The ultrasonic transducer according to claim 8, further comprising another matching layer disposed below the second electrode layer, wherein the another matching layer is an insulation layer.

10. The ultrasonic transducer according to claim 1, wherein the piezoelectric material layer is divided into a plurality of sections in an extension direction, and the first electrode layer is divided into a plurality of sections in the extension direction, so as to form a plurality of elements arranged in the extension direction.

11. The ultrasonic transducer according to claim 1, wherein the ultrasonic transducer is a linear transducer, a phase array transducer, a curved transducer, a circular transducer, or a combination thereof.

12. An ultrasonic transducer, comprising:

a piezoelectric material layer, having an ultrasonic wave emitting side and a back side opposite to the ultrasonic wave emitting side, wherein the piezoelectric material layer has a protrusion structure or a recess structure only on the back side but not on the ultrasonic wave emitting side, the protrusion structure or the recess structure has a width d, the back side of the piezoelectric material layer has a width D, and d>D/5;

a first electrode layer, disposed on the back side of the piezoelectric material layer; and a second electrode layer, disposed on the ultrasonic wave emitting side of the piezoelectric material layer.

13. The ultrasonic transducer according to claim 12, wherein d<D/2.

14. The ultrasonic transducer according to claim 12, wherein a height of the protrusion structure or a depth of the recess structure is h, the piezoelectric material layer at the protrusion structure or the recess structure has a thickness H, and $\frac{1}{10}<h/H<\frac{1}{3}$.

15. The ultrasonic transducer according to claim 12, wherein the piezoelectric material layer has the recess structure on the back side, the recess structure has two sidewall surfaces opposite to each other and a bottom surface, and the bottom surface is connected to the two sidewall surfaces.

16. The ultrasonic transducer according to claim 15, wherein the two sidewall surfaces are perpendicular to the bottom surface.

17. The ultrasonic transducer according to claim 15, wherein the two sidewall surfaces are inclined relative to the bottom surface.

18. The ultrasonic transducer according to claim 12, wherein the piezoelectric material layer has the protrusion structure on the back side, the protrusion structure has two sidewall surfaces opposite to each other and a top surface, and the top surface is connected to the two sidewall surfaces.

19. The ultrasonic transducer according to claim 18, wherein the two sidewall surfaces are perpendicular to the top surface.

20. The ultrasonic transducer according to claim 18, wherein the two sidewall surfaces are inclined relative to the top surface.

* * * * *